(12) United States Patent
Tani

(10) Patent No.: US 6,813,598 B1
(45) Date of Patent: Nov. 2, 2004

(54) LOGIC SIMULATION METHOD AND LOGIC SIMULATION APPARATUS

(75) Inventor: Takahiro Tani, Hyogo (JP)

(73) Assignees: Renesas Technology Corp., Tokyo (JP); Mitsubishi Electric System LSI Design Corporation, Itami (JP)

( * ) Notice: Subject to any disclaimer, the term of this patent is extended or adjusted under 35 U.S.C. 154(b) by 817 days.

(21) Appl. No.: 09/617,285

(22) Filed: Jul. 17, 2000

(30) Foreign Application Priority Data

Feb. 4, 2000 (JP) ........................................ 2000-028336

(51) Int. Cl.[7] ............................................. G06F 17/50
(52) U.S. Cl. ........................ 703/14; 703/15; 714/733
(58) Field of Search .................... 703/3, 14, 15–17; 714/720, 733, 743, 726; 716/6; 361/788; 365/201, 207

(56) References Cited

U.S. PATENT DOCUMENTS

| 4,293,950 | A | * | 10/1981 | Shimizu et al. | ............. | 714/743 |
| 5,392,227 | A | | 2/1995 | Hiserote | ...................... | 703/14 |
| 5,677,856 | A | * | 10/1997 | Tani | ............................ | 703/3 |
| 5,761,215 | A | * | 6/1998 | McCarthy et al. | .......... | 714/726 |
| 5,923,601 | A | * | 7/1999 | Wendell | ...................... | 365/201 |
| 5,946,253 | A | * | 8/1999 | Fujiwara | ..................... | 365/207 |
| 6,421,251 | B1 | * | 7/2002 | Lin | ............................ | 361/788 |
| 6,467,056 | B1 | * | 10/2002 | Satou et al. | ................. | 714/720 |
| 6,470,482 | B1 | * | 10/2002 | Rostoker et al. | ............... | 716/6 |
| 6,496,952 | B1 | * | 12/2002 | Osada et al. | ................. | 714/733 |

FOREIGN PATENT DOCUMENTS

| JP | 8-503794 | 4/1996 |
| JP | 10-187484 | 7/1998 |

OTHER PUBLICATIONS

Schultz et al., "Low supply noise low power embedded modular SRAM", IEEE 1996.*
Adams et al., "A self–test circuit for evaluating memory sense amplifier signal", IEEE 1997.*

* cited by examiner

Primary Examiner—Samuel Broda
Assistant Examiner—Kandasamy Thangavelu
(74) Attorney, Agent, or Firm—Burns, Doane, Swecker & Mathis, L.L.P.

(57) ABSTRACT

An MWL signal encoding part encodes a signal occurring on a main word signal line, an SD signal encoding part encodes a signal occurring on a subdecode signal line, a WL calculating part calculates a WL value, based on an MWL signal encoded value and an SD signal encoded value; an input and output operation part allows one-word data in a memory cell selected by the WL value to be read and written via the bit signal line; and a read and write control part controls a read operation and a write operation of the input and output operation part, based on a signal level on the bit signal line.

6 Claims, 7 Drawing Sheets

LOGIC SIMULATION METHOD AND LOGIC SIMULATION APPARATUS

BACKGROUND OF THE INVENTION

1. Field of the Invention

The present invention generally relates to logic simulation methods and logic simulation apparatuses and, more particularly, to a logic simulation method and logic simulation apparatus for testing logic design of the entirety of a semiconductor integrated circuit chip such as a large capacity memory in which a memory cell array is divided into subarrays, an ASIC carrying a large capacity memory, and a system LSI.

2. Description of the Related Art

In testing logic design of the entirety of a semiconductor integrated circuit chip such as a large capacity memory in which a memory cell array is divided into subarrays, an ASIC carrying a large capacity memory, and a system LSI, a logic simulation method and a logic simulation apparatus implementing the method are used. The logic simulation method and the logic simulation apparatus enable top-down design or bottom-up design by describing an arrangement of memory cell arrays and sense amplifiers using an operation mode so that the size of memory consumed in (process size) and the time required for execution of logic simulation are reduced. The above-described related-art logic simulation method and the logic simulation apparatus implementing the method use models effective at the level of transistors and gate elements. As compared with other simulation procedures executing logic simulation of all the circuit models, the method and apparatus described above are capable of reducing the size of memory consumed in logic simulation and the time required for execution of logic simulation.

In the above-described related-art logic simulation method and apparatus, memory cell arrays, subdecoders, sense amplifiers and I/O gates that constitute a memory core part are treated as separate blocks. Operation models of the memory cell arrays and the sense amplifiers are created. With regard to the subdecoders and the I/O gates, operation models effective at the level of transistor and elements are created to perform simulation.

Since the logic simulation method and apparatus according to the related art are constructed as described above, the number of events such as exchange of signals between blocks and variation in signal level grow to an extent that a sufficient simulation performance is not obtained.

SUMMARY OF THE INVENTION

Accordingly, a general object of the present invention is to provide a logic simulation method and a logic simulation apparatus in which the aforementioned problem is eliminated.

Another and more specific object of the present invention is to provide a logic simulation apparatus and a logic simulation method for use in testing logic design of the entirety of a semiconductor integrated circuit chip such as a large capacity memory, an ASIC carrying a large capacity memory, and a system LSI, in which the size of memory consumed in simulation and the time required for simulation are reduced so that a sufficient simulation performance is provided.

The aforementioned objects can be achieved by a mixed-level logic simulation apparatus comprising: memory cell array subdecoder operation model providing means for providing an operation model corresponding to a memory cell array and a subdecoder circuit; a sense amplifier and I/O gate operation model providing means for providing an operation model corresponding to a sense amplifier and an I/O gate circuit; a transistor and gate element operation model providing means for providing an operation model of a transistor and a gate element; circuit connection data providing means for providing circuit connection data prescribing connection of logic circuits; input test pattern providing means for providing a test pattern to an input part of the logic circuit; function and logic simulation means for executing logic simulation of the logic circuit based on the input test pattern; simulation result displaying means for displaying a result of simulation obtained by the function and logic simulation execution means in order to verify that a function of the logic circuit is realized, wherein circuit operation of the logic circuit comprising transistors, logic gates and functional blocks is tested using models of switches, gates and functions.

The memory cell array subdecoder operation model providing means may build an operation model by regarding the memory cell array and the subdecoder as one block; and the memory cell array subdecoder operation providing means may comprise: first signal variation detection means for detecting a variation in signal level occurring on a main word signal line, a subdecode signal line and a bit signal line; MWL signal encoding means for encoding a signal on the main word signal line; MWL signal encoded value retaining means for retaining an MWL signal encoded value obtained by the MWL signal encoding means; SD signal encoding means for encoding a signal on the subdecode signal line; SD signal encoded value retaining means for retaining an SD signal encoded value obtained by the SD signal encoding means; WL calculation means for calculating a WL value for a word number indicating a selected word line, based on the MWL signal encoded value and the SD signal encoded value; WL value retaining means for retaining the WL value obtained by the WL calculating means; memory cell data retaining means for retaining logic data corresponding to a memory cell having a size corresponding to a number obtained by multiplying a bitwise width of the word line indicated by the WL value stored in the WL value retaining part and a bitwise width of a bit signal line; first input and output operation means for allowing one-word data in the memory cell selected by the WL value to be read and written via the bit signal line; and first read and write control means for controlling a read status and a write status of the first input and output operation means, based on a signal level occurring on the bit signal line.

The sense amplifier and I/O gate operation model providing means may build an operation model by regarding the sense amplifier and the I/O gate as one block; and the sense amplifier and I/O gate operation model providing means may comprise: second signal variation detecting means for detecting variation in signal level on the bit signal line, a column selection line, a global IO line, a bit line connection control signal line, a bit line equalizing signal line and a sense enable signal line; CSL signal encoding means for encoding a signal on the column selection line; CSL signal encoded value retaining means for retaining a CSL signal encoded value obtained by the CSL signal encoding means; sense amplifier data retaining means for retaining logic data corresponding to the sense amplifier register corresponding to the bitwise width of the bit signal line; second input and output operation means for allowing data in the sense amplifier register data retaining means, which data is selected based on the CSL signal encoded value stored in the CSL signal encoded value retaining part, to be read and written via the global IO signal line; third input and output operation means for allowing data in the sense amplifier register data retaining means to be read and written via the bit signal line; and second read and write control means for controlling a read status and a write status of the second input and output operation means and the third input and output operation means, based on a signal level occurring on the bit signal line, the global IO signal line, the bit line connection control signal line, the bit line equalizing signal line and the sense enable signal line.

The first signal variation detection means may determine whether at least one of the bits occurring on plural-bit signal lines having a width of a plurality of bits subject to encoding is 1, the plural-bit signal lines including the main word signal line and the subdecode signal line; and wherein when it is determined that at least one of the bits is 1, a determination is made as to which bit of the plurality of bits constituting a plural-bit signal is selected.

The second first signal variation detection means may determines whether at least one of the bits occurring on plural-bit signal lines having a width of a plurality of bits subject to encoding is 1, the plural-bit signal lines including the column selection line; and wherein when it is determined that at least one of the bits is 1, a determination is made as to which bit of the plurality of bits constituting a plural-bit signal is selected.

The aforementioned objects can also be achieved by a mixed-level logic simulation method comprising the steps of: providing an operation model corresponding to a memory cell array and a subdecoder circuit; providing an operation model corresponding to a sense amplifier and an I/O gate circuit; providing an operation model for transistors and gate elements; providing circuit connection data prescribing connection of the logic circuit; providing an input test pattern to an input part of the logic circuit; executing logic simulation of the logic circuit, based on the input test pattern; and displaying a result of simulation in order to verify that a function of the logic circuit is realized; wherein circuit operation of the logic circuit comprising transistors, logic gates and function blocks may be verified, using models of switches, gates and functions.

BRIEF DESCRIPTION OF THE DRAWINGS

Other objects and further features of the present invention will be apparent from the following detailed description when read in conjunction with the accompanying drawings, in which.

DETAILED DESCRIPTION OF THE PREFERRED EMBODIMENTS

Embodiment 1

Figure 1:
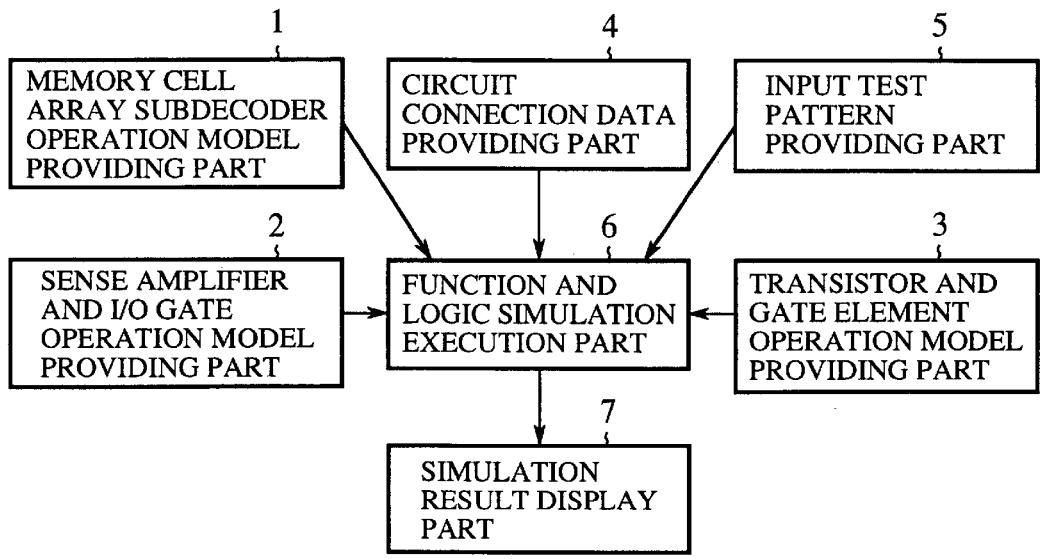
FIG. 1 is a block diagram showing a logic emulation apparatus according to a first embodiment of the present invention.

FIG. 1 is a block diagram showing a logic emulation apparatus according to a first embodiment of the present invention. Referring to FIG. 1, numeral 1 indicates a memory cell array and subdecoder operation model providing part for providing an operation model of memory cells and subdecoders in a semiconductor integrated circuit subject to simulation. Numeral 2 indicates a sense amplifier and I/O gate operation model providing part for providing an operation model corresponding to sense amplifiers and I/O gate circuits in the semiconductor integrated circuit subject to simulation.

Numeral 3 indicates a transistor and gate element operation model providing part for providing an operation model of transistors and gate elements in the semiconductor integrated circuit subject to simulation, and numeral 4 indicates a circuit connection data providing part for providing circuit connection data prescribing the connection in a logic circuit in the semiconductor integrated circuit subject to simulation. It is assumed herein that the logic circuits are constructed of transistors, logic gates and functional blocks.

Numeral 5 indicates an input test pattern providing part for applying a test pattern to an input part of the logic circuit, and numeral 6 indicates a function and logic simulation execution part for performing logic simulation of the logic circuit based on the input test pattern.

Numeral 7 indicates a simulation result display part such as a display for modifying a simulation result such as information relating to variation in an output signal from the function and logic simulation execution part 6, and displaying the simulation result thus modified so that a designer is able to see the simulation result.

Figure 2:
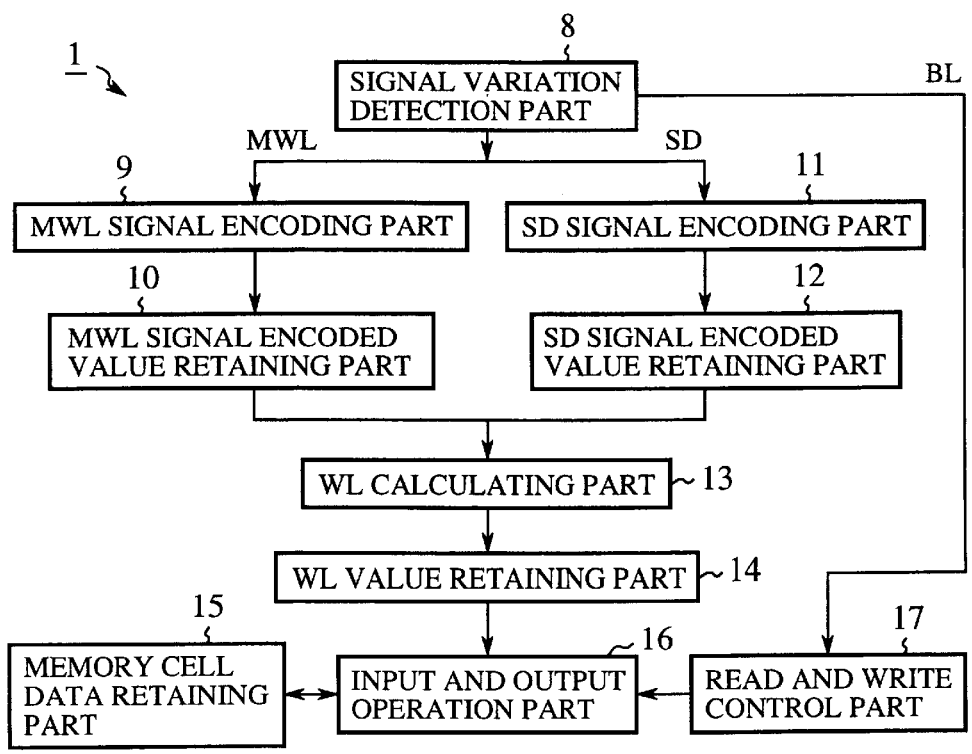
FIG. 2 showing a construction of a memory cell array and subdecoder operation model providing part in the logic simulation apparatus shown in FIG. 1.

FIG. 2 is a block diagram showing a construction of a memory cell array and subdecoder operation model providing part 1 in the logic simulation apparatus shown in FIG. 1. Referring to FIG. 2, numeral 8 indicates a signal variation detection part for detecting variation in signal level on a main word signal line MWL, a subdecode signal line SDL and a bit signal line BL. Numeral 9 indicates an MWL signal encoding part and numeral 10 indicates an MWL signal encoded value retaining part.

Numeral 11 indicates an SD signal encoding part for encoding a signal on the subdecode signal line SD, numeral 12 indicates an SD signal encoded value retaining part for retaining an SD signal encoded value produced by the SD signal encoding part 11, numeral 13 indicates a W/L calculating part for calculating a word number indicating a word line selected based on the MWL signal encoded value and the SD signal encoded value. Numeral 14 indicates a WL value retaining part, numeral 15 indicates a memory cell data retaining part for retaining logic data in memory cells having a size corresponding to the number obtained by multiplying the bitwise width of the word line WL and the bitwise width of the bit signal line BL. Numeral 16 indicates an input and output operation part for allowing one-word data in the memory cell selected by the WL value in the WL value retaining part 14 to be read and written via the bit signal line BL. Numeral 17 indicates a read and write control part for controlling a read status and a write status of the input and output operation part 16, based on the signal on the bit signal line BL.

Figure 3:
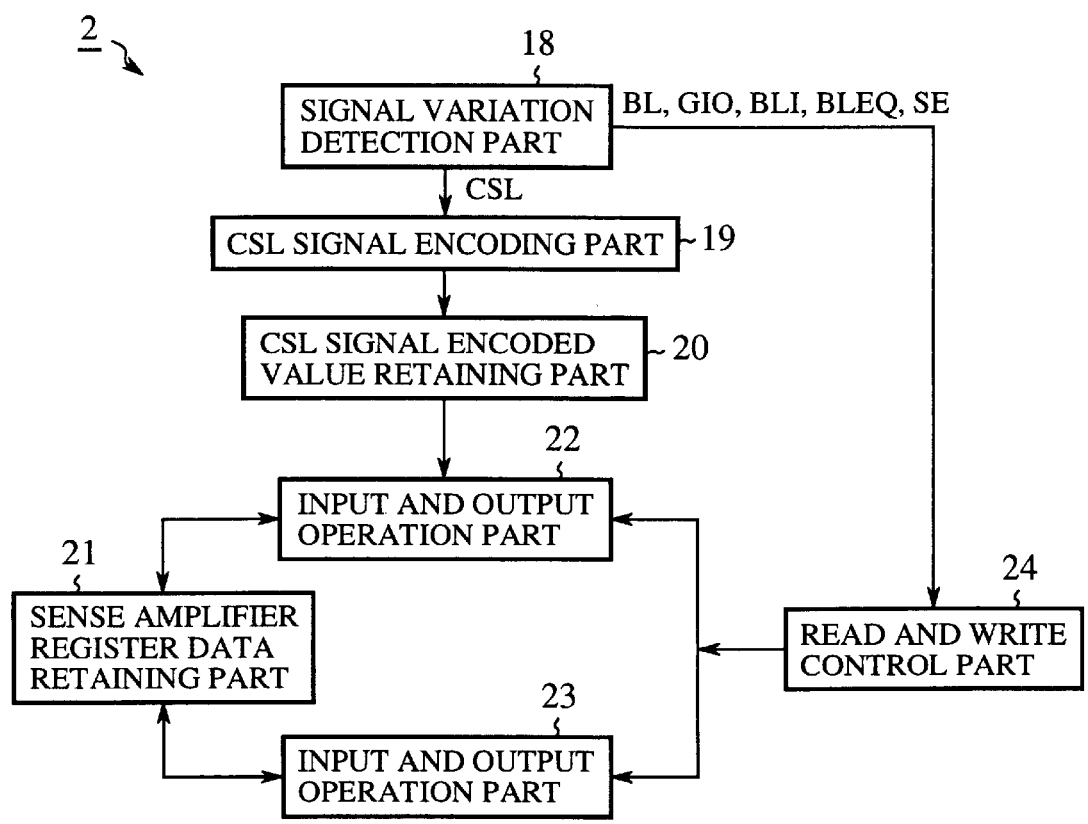
FIG. 3 is a block diagram showing a construction of a sense amplifier and I/O gate operation model providing part in the logic simulation apparatus shown in FIG. 1.

FIG. 3 is a block diagram showing a construction of a sense amplifier and I/O gate operation model providing part 2 in the logic simulation apparatus shown in FIG. 1. Numeral 18 indicates a signal variation detection part for detecting variation in signal level on the bit signal line BL, a column selection line CSL, a global IO signal line GIO, a bit line connection signal line BLI, a bit line equalizing signal line BLEQ and a sense enable signal line SE. Numeral 19 indicates a CSL signal encoding part for encoding a signal on the column selection signal line CSL. Numeral 20 indicates a CSL signal encoded value retaining part for retaining,the CSL signal encoded value produced by the CSL signal encoding part 19.

Numeral 21 indicates a sense amplifier register data retaining part for retaining logic data corresponding to sense amplifier registers having a size corresponding to the number equal to the bitwise width of the, bit signal line BL. Numeral 22 indicates an input and output operation part for allowing data in the sense amplifier register retaining part 21, which data is selected by the CSL signal encoded value, to be read and written via the global IO signal line GIO. Numeral 23 indicates an input and output operation part for allowing data in the'sense amplifier register data retaining part 21 to be read and written via the bit signal line BL. Numeral 24 indicates read and write control part for controlling a read status and a write status of the input and output operation part 22 and the input and output operation part 23, based on the signals on the bit signal line BL, the global IO signal line GIO, the bit line connection control signal line BLI, the bit line equalizing signal line BLEQ and the sense enable signal line SE.

A description will now be given of the operation according to the first embodiment.

Figure 4:
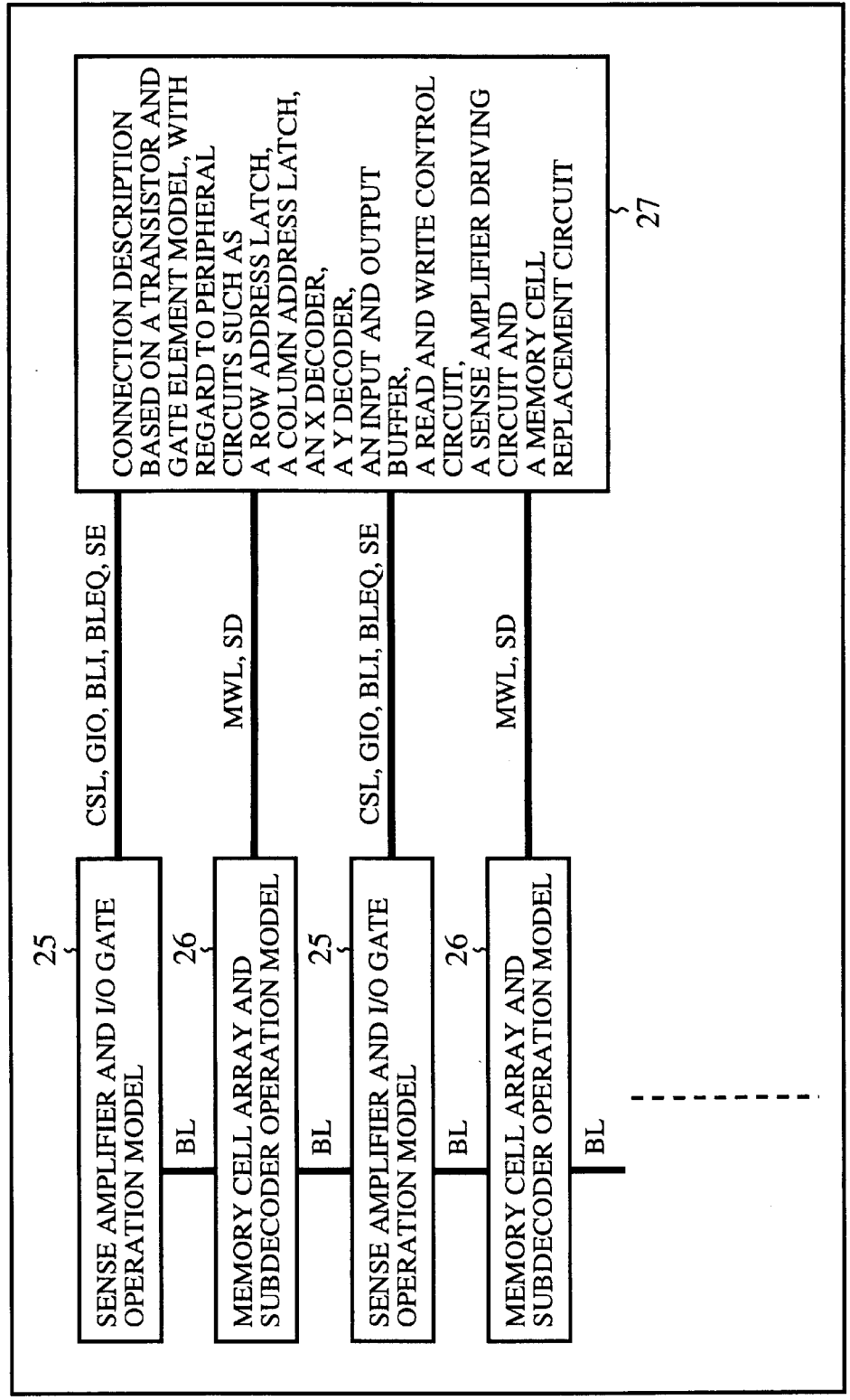
FIG. 4 shows circuit connection data established by the logic simulation apparatus shown in FIG. 1 with regard to a memory core part according to the shared sense amplifier method.
Figure 5:
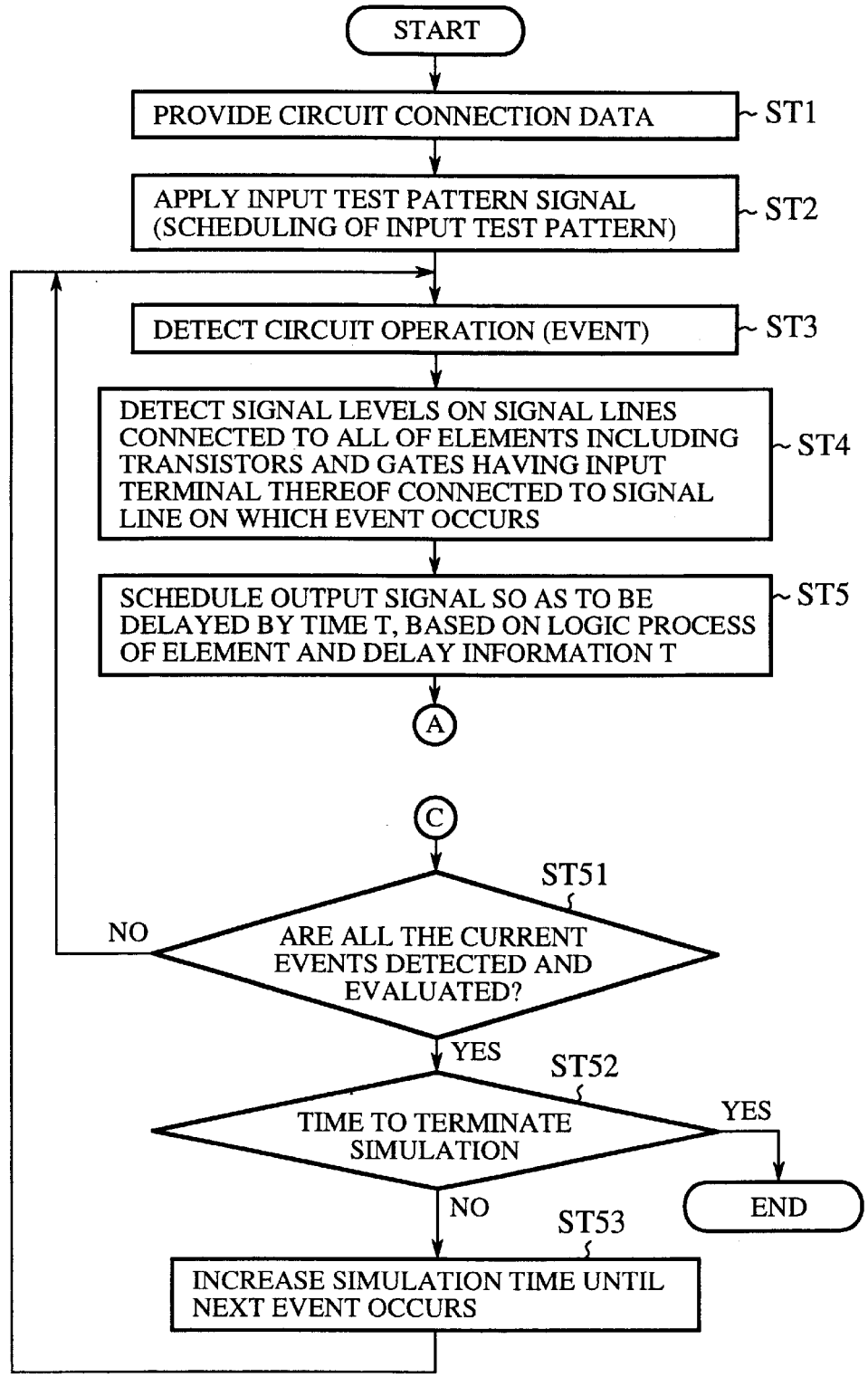
FIG. 5 is a flowchart showing a logic simulation method according to the first embodiment.

FIG. 4 shows circuit connection data established by the logic simulation apparatus shown in FIG. 1 with regard to a memory core part according to the shared sense amplifier method. Referring to FIG. 4, numeral 25 indicates a sense amplifier and I/O gate operation model provided by the sense amplifier and I/O gate operation model providing part 2, numeral 26 indicates a memory cell array and subdecoder operation model supplied by the memory cell array and subdecoder operation model providing part 1, numeral 27 indicates connection description based-on a transistor and gate element model, with regard to peripheral circuits such as a row address latch, a column address latch, an X decoder, a Y decoder, an input and output buffer, a read and write control circuit, a sense amplifier driving circuit and a memory cell replacement circuit.

FIGS. 5, 6, 7 and 8 are flowcharts showing a logic simulation method executed by the logic simulation method shown in FIG. 1.

In the simulation, the circuit connection data providing part 4 receives circuit connection data with regard to a memory core part subject to simulation according to the shared sense amplifier method (step ST1). The circuit connection data is net list data describing the connection between the operation models 25 and 26, and the peripheral circuits connected thereto.

Subsequently, an input test pattern applied to an input terminal and an input and output terminal of a logic circuit subject to simulation is fed to the input test pattern providing part 5. The function and logic simulation execution part 6 starts executing the logic simulation using the circuit connection data obtained by the circuit connection data providing part 4 and the input test pattern obtained by the input test pattern providing part 5. The function and logic simulation execution part 6 applies the input test pattern to the circuit connection data with regard to the memory core part which data is fed to the circuit connection data providing part 4 and then schedules the input test pattern (step ST2).

The function and logic simulation execution part 6 starts the logic simulation on the circuit connection data, based on the input test pattern.

Subsequently, the function and logic simulation execution part 6 detects the circuit operation (event) of the sense amplifier and I/O gate operation model 25 built by the sense amplifier and I/O gate operation model providing part 2, and the memory cell array and subdecoder operation model 26 built by the memory cell array and subdecoder operation model providing part 1 (step ST3).

The function and logic simulation execution part 16 then detects signal levels on the signal lines connected to all of the elements including transistors and gates having an input terminal thereof connected to a signal line on which an event occurs (step ST4). The function and logic simulation execution part 16 delays the output signal by time t, based on delay information t indicating a logic process and delay level of each of the elements (step ST5).

Figure 6:
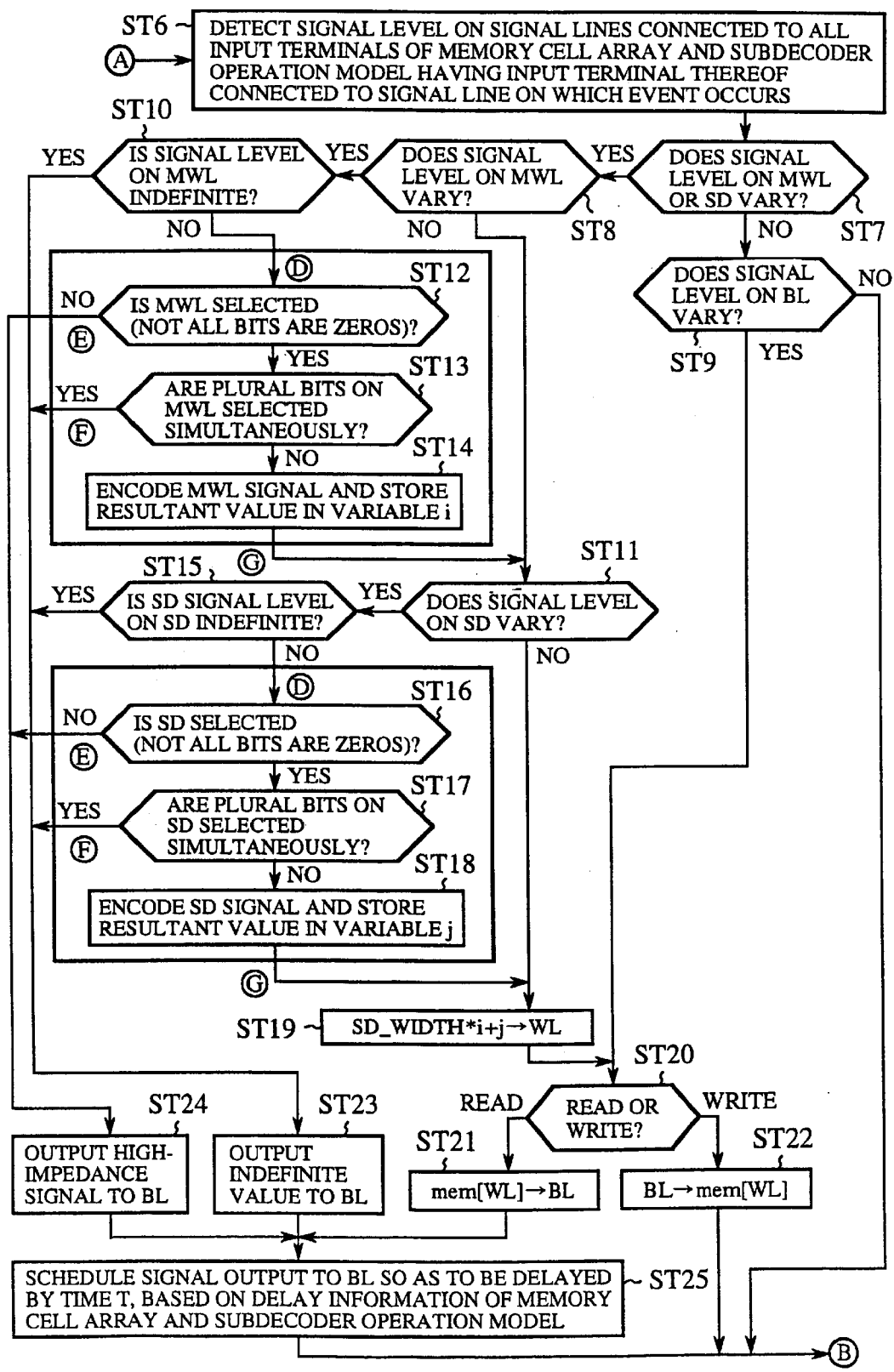
FIG. 6 is another flowchart showing the logic simulation method according to the first embodiment.

When an event indicating a variation in a signal level occurs during the logic simulation on any of the main word signal line MWL, the subdecode signal line SD and the bit signal line BL connected to the input terminal or the input and output terminal of the memory cell array subdecoder 26 built by the memory cell array subdecoder operation model providing part 1, control is turned to step ST6 of the flowchart of FIG. 6, wherein input and output of the signal takes place.

Referring to the flowchart of FIG. 6, the signal variation detection part 8 detects signal levels on the signal lines connected to all of the input terminals of the memory cell array subdecoder operation model 26 having an input and output terminal thereof connected to the signal line on which the event occurs (step ST6). The signal variation detection part checks variation in signal level occurring on the main word signal line MWL or the subdecode signal line SD (step ST7).

When it is determined as a result of the check in step ST7 that there is a variation in signal level on the main word signal line MWL or the subdecode signal line SD, control is turned to step ST8. When it is determined as a result of the check in step ST7 that there is no variation in signal level occurring on the main word signal line MWL or the subdecode signal line SD, control is turned to step ST9. The process in step ST9 will be described later.

In step ST8, a check is made as to whether there is a variation in signal level occurring on the main word signal line MWL. When there is a variation in signal level occurring on the main word signal line MWL, control is turned to step ST10. When there is no variation in signal level occurring on the main word signal line MWL, control is turned to step ST11. The process in step ST10 will be described later.

When it is determined as a result of the check in step ST8 that there is a variation in signal level occurring on the main word signal line MWL, a check is made.as to whether the signal level occurring on the main word signal line MWL is indefinite (step ST10). When it is determined as a result of the check in step ST10 that the signal level occurring on the main word signal line MWL is not indefinite, a check is made as to whether the main word signal line MWL is selected, that is, whether all the bits on the main word signal line MWL are zeros (step ST12).

When it is determined as a result of the check in step ST12 that not all the bits on the main word signal line MWL are zeros, that is, the main word signal line MWL is selected, a check is made as to whether a plurality of bits on the main word signal line MWL are simultaneously selected (step ST13).

When it is determined as a result of the check in step ST13 that a plurality of bits on the main word signal line MWL are not simultaneously selected, control is turned to step ST14. In step ST14, the MWL signal encoding part 9 encodes the signal on the main word signal line MWL so that the MWL signal encoded value retaining part 10 stores, in a variable i, an encoded value indicating which of the signal lines constituting the main word signal line MWL is selected (step ST14). Subsequently, control is turned to step ST11.

In step ST11, a check is made as to whether the signal level occurring on the subdecode signal line SD varies. When it is determined as a result of the check in step ST11 that the signal level occurring on the subdecode signal line SD varies, control is turned to step ST15, where the signal level occurring on the subdecode signal line SD is indefinite.

When it is determined as a result of the check in step ST15 that the signal level occurring on the subdecode signal line SD is not indefinite, a check is made as to whether the subdecode signal line SD is selected. That is, a check is made as to whether all the bits on the subdecode signal line SD are zeros (step ST16). When it is determined as a result of the check in step ST16 that the subdecode signal line SD is selected, a check is made in step ST17 as to whether a plurality of bits on the subdecode signal line SD are simultaneously selected (step ST17).

When it is determined as a result of the check in step ST17 that a plurality of bits on the subdecode signal line SD are not simultaneously selected, the SD signal encoding part 11 encodes the signal value on the subdecode signal line SD so that the SD signal encoded value retaining part 12 stores, in a variable j, the encoded indicating which of the signal lines constituting the subdecode signal line SD is selected (step ST18). Control is then turned to step ST19.

In step ST19, the (SD_WIDTH*i+j)th line of the word line WL is selected, using the values stored in the variables i and J, and the bitwise width of the subdecode signal line SD (step ST19).

When the process in step ST19 is completed, control is turned to step ST20. When it is determined that the signal value on the bit signal line BL varies as a result of the check in step ST9, control is turned to step ST20. In step ST20, a check is made as to whether a read operation or a write operation caused the variation (step ST20). When it is determined that a write operation caused the variation, control is turned to step ST22.

In step ST22, one-word data mem[WL] corresponding to the bitwise width of the bit signal line BL is stored in the memory cell data retaining part 15 (step ST22). It is to be noted that mem[WL] is one-word data in the memory cell data retaining part 15, which data is identified by calculation by the WL calculating part 13 shown in FIG. 2.

When it is determined as a result of the check in step ST20 that a read operation caused the variation, control is turned to step ST21. In step ST21, bit signal line BL is selected based on the one-word data mem[WL] corresponding to the width of the bit signal line BL, the one-word data being stored in the memory cell data retaining part 15 (step ST21). Control is then turned to step ST25.

When it is determined as a result of the check in step ST10 that the signal value on the main word signal line MWL is indefinite, or when it is determined as a result of the check in step ST13 that a plurality of bits are simultaneously selected on the main word signal line MWL, or when it is determined as a result of the check in step ST15 that the signal value on the subdecode signal line SD is indefinite, or when it is determined as a result of the check in step ST17 that a plurality of bits on the subdecode signal line SD are simultaneously selected, control is turned to step ST23, where an indefinite value is output to the bit signal line BL (step ST23).

When it is determined as a result of the check in step ST12 that the main word signal line MWL is not selected, or when it is determined as a result of the check in step ST16 that the subdecode signal line SD is not selected, control is turned to step ST24. In step ST24, a high-impedance signal is output to the bit signal line BL (step ST24).

When the processes in steps ST21, ST23 and ST24 have been completed, control is turned to step ST25. In step ST25, the signal output to the bit signal line BL is scheduled so that the output signal is delayed by time t, based on delay information t indicating a delay in the memory cell array and subdecoder operation model 26 obtained by the memory cell array subdecoder operation model providing part 1 (step ST25).

In step ST9, a check is made as to whether there is a variation in signal level occurring on the bit signal line BL (step ST9). When there is a variation on the bit signal line BL, control is turned to step ST20. When it is determined in step ST9 that there is no variation in signal level occurring on the bit signal line BL, or when the process in step ST22 or step ST25 has been completed, control is turned to step ST26 shown in FIG. 7.

Figure 7:
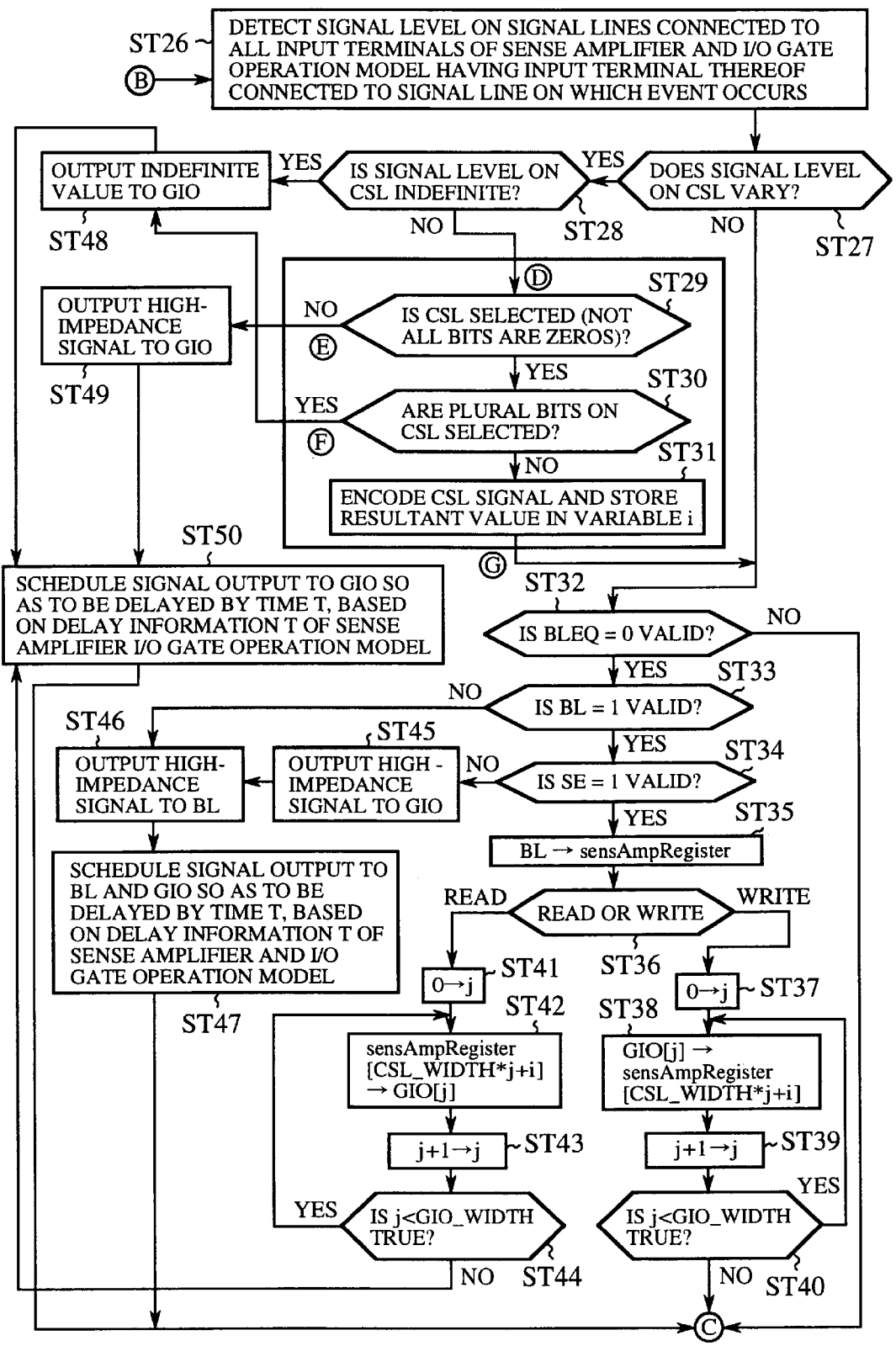
FIG. 7 is still another flowchart showing the logic simulation method according to the first embodiment.

When control proceeds from steps ST9, ST22, ST25 shown in FIG. 6 through step ST26 shown in FIG. 7, it is determined that an event has occurred during the logic simulation in one of the signal lines including the bit signal line BL, the column selection line CSL, the global IO line GIO, the bit line connection control signal line BLI, the bit line equalizing signal line BLEQ and the sense enable signal line SE connected to the input terminal or the input and output terminal within the sense amplifier and I/O gate operation model 25. In this case, an input and output operation is conducted based on step ST26 and subsequent steps in the flowchart of FIG. 7. Referring to FIG. 7, GIO_WIDTH indicates a bitwise width of the global IO line GIO, GIO[j] indicates a jth bit, sensAmpRegister indicates an array name storing a sense amplifier register, CSL_WIDTH indicates a bitwise width of the column selection line CSL, and i indicates a bit number of the selected column selection line CSL.

In step ST26 in the flowchart of FIG. 7, the signal variation detection part 18 detects signal variation of the signals on the signal lines connected to the all of the input terminals of the sense amplifier and I/O gate operation model 25 connected to the signal line on which the event occurred (step ST26).

Subsequently, in step ST27, a check is made as to whether the signal level occurring on the column selection line CSL has changed (step ST27). When there is a variation in signal level occurring on the column selection line CSL, a check is made in step ST28 as to whether the signal level occurring on the column selection line CSL is indefinite (step ST28).

When it is determined in step ST28 that the signal level occurring on the column selection line CSL is not indefinite, control is turned to step ST29. In step ST29, a check is made as to whether the column selection line CSL is selected, that is, whether all the bits on the column selection line CSL are zeros (step ST29). When it is determined as a result of the check in step ST29 that not all the bits on the column selection line CSL are zeros, that is, the column selection line CSL is selected, control is turned to step ST30 where a check is made as to whether a plurality of bits on the column selection line CSL are simultaneously selected (step ST30).

When it is determined as a result of the check in step ST30 that a plurality of bits on the column selection line CSL are not simultaneously selected, the signal on the column selection line CSL is encoded by the CSL signal encoding part 19 so that the CSL signal encoded value retaining part 20 stores, in a variable i, the encoded value indicating which of the signal lines constituting the column selection line CSL is selected (step ST31). Control is then turned to step ST32.

In step ST32, a check is made as to whether the level of the bit line equalizing signal line BLEQ is zero (step ST32). When the level occurring on the bit line equalizing signal line BLEQ is zero, control is turned to step ST33 where a check is made as to whether the level occurring on the bit line connection control signal line BLI is 1 (step ST33).

When it is determined as a result of check in step ST33 that the level occurring on the bit line connection control signal line BLI is 1, control is turned to step ST34 where a check is made as to whether the level occurring on the sense enable signal line SE s 1 (step ST34). If it is determined as a result of the check in step ST34 that the level occurring on the sense enable signal line SE is 1, control is turned to step ST35.

In step ST35, the signal level occurring on the bit signal line BL is stored in the sense amplifier register sensAmpRegister within the sense amplifier data retaining part 21 (step ST35). It is to be noted that sensAmpRegister[SCL_WIDTH*j+i] indicates the [CSL_WIDTH+j+i]th array item in the sense amplifier register.

Subsequently, in step ST36, a determination between a read operation and a write operation is made (step ST36). In case of a write operation, control is turned to step ST37.

In step ST37, a value 0 is substituted into the variable j (step ST37). Subsequently, in step ST38, the signal level occurring on the jth line of the global IO line GIO is stored in the [CSL_WIDTH*j+i]th area in sensAmpRegister in the sense amplifier register data retaining part 21 (step ST38).

Subsequently, in step ST39, the stored value is incremented by 1 (step ST39). As a result, the stored value becomes j+1. Subsequently, in step ST40, a check is made as to whether the variable j is greater than the value [GIO_WIDTH] (step ST40). If the relation j<[GIO_WIDTH] is valid, control is turned to step ST38. If the relation j<[GIO_WIDTH] is not valid, control is turned to step ST51 of FIG. 5.

If it is determined as a result of the check in step ST36 that the read operation has occurred, control is turned to step ST41. In step ST41, a value 0 is substituted into the variable j (step ST41).

Subsequently, in step ST42, the data stored in the [CSL_WIDTH*j+i]th area in the sensAmpRegister is provided as the jth bit value of the global IO line GIO (step ST42).

In step ST43, the value j is incremented by 1. As a result, the value j becomes j+1 (step ST43). Subsequently, in step ST44, a check is made as to whether the variable j is greater than the value [GIO_WIDTH] (step ST44). If the relation j<[GIO_WIDTH] is valid, control is returned to step ST42. If the relation j<[GIO_WIDTH] is not valid, control is turned to step ST50.

If it is determined as a result of the check in step ST34 that the level occurring on the sense enable signal line SE is zero, control is turned to step ST45. In step ST45, a high-impedance signal is output to the global IO line GIO (step ST45).

If it is determined as a result of the check in step ST33 that the level occurring on the bit line connection control signal line BLI is zero, control is turned to step ST46. When the process in step ST45 is complete, control is turned to step ST46. In step ST46, a high-impedance signal is output to the bit signal line BL (step ST46).

Control is then turned to step ST47. In step ST47, the signal output to the bit signal line BL and the global IO line GIO is scheduled so that the output signal is delayed by time t, based on delay information t indicating a delay in the sense amplifier and I/O gate operation model 25 (step ST47).

When it is determined as a result of the check in step ST28 that the signal level occurring on the column selection line CSL is indefinite, or when it is determined as a result of the check in step ST30 that a plurality of bits on the column selection line CSL are simultaneously selected, control is turned to step ST48. In step ST48, an indefinite value is output to the global IO line GIO (step ST48).

When it is determined as a result of the check in step ST29 that the column selection line CSL is not selected, control is turned to step ST49. In step ST49, a high-impedance signal is output to the global IO line GIO (step ST49).

When the process in step ST48 is complete, or when the process in step ST49 is complete, or when it is determined as a result of the check in step ST44 that the relation j<GIO_WIDTH is not valid, control is turned to step ST50. In step ST50, the signal output to the global IO line GIO is scheduled so that the output signal is delayed by time t, based on delay information t indicating a delay in the sense amplifier and I/O gate-operation model 25 (step ST50).

When the process in step ST50 is complete, or when the process in step ST47 is complete, or when it is determined as a result of the check in step ST32 that the level occurring on the bit line equalizing signal line BLE is not zero, or when it is determined as a result of the check in step ST40 that the relation j<GIO_WIDTH is not valid, control is turned to step ST51. In step ST51, a check is made as to whether all the current vents have been detected (step ST51).

When it is determined as a result of the check in step ST51 that all the current events have been detected, control is turned to step ST52. In step ST52, a check is made as to whether it is time to terminate the simulation. When it is time to terminate the simulation, the simulation is terminated. When it is not time to terminate the simulation, the simulation time is increased until a next event occurs (step ST53). Control is then turned to step ST53. When it is determined as a result of the check in step ST51 that not all the current events are detected, control is returned to step ST3 whereupon the sequence described above is repeated.

Thus, according to the first embodiment, the signal variation detection part 8 in the memory cell array subdecode operation model providing part 1 detects a variation in signal value occurring on the main word signal line MWL, the subdecode signal line SD and the bit signal line BL, the memory cell array and subdecoder operation model providing part 1 operating by regarding the memory cell array and the subdecoder as one block. The WL calculating part 13 identifies by calculation the word line WL, based on the MWL signal encoded value obtained by the MWL signal encoding part 9 and the SD signal encoded value obtatined by the SD signal encoding part 11. The input and output operation part 16 allows the one-word data in the memory cell selected by the word line identified by calculation by the WL calculating part 13 to be input and output via the bit signal line BL. With this, the word line WL between the memory cell array and the subdecoder can remain encoded in the operation model, while being operated to select a word in the memory cell array. Thus, the size of data constituting word line selection information can be reduced. By subjecting the main word signal line MWL and the subdecode signal line SD to encoding instead of encoding the signal on the word line WL as is conventionally done, the size of data array storing data subject to a search during encoding is reduced. Thus, the size of the memory consumed during the logic simulation is reduced and the performance of simulation is improved.

The signal variation detection part 18 in the sense amplifier and I/O gate operation model providing part 2 detects a variation in signal value occurring on the bit signal line BL, the column selection line CSL, the global IO line GIO, the bit line connection control signal line BLI, the bit line equalizing signal line BLEQ and the sense enable signal line SE, the sense amplifier and I/O gate operation model providing part 2 operating by regarding the sense amplifier and the I/O gate as one block. The CSL signal encoding part 19 encodes the signal on the column selection line CSL and stores the CSL signal encoded value thus produced in the CSL signal encoding value retaining part 20. The input and output operation part 22 allows data in the sense amplifier register retaining part 21 selected by the CSL signal encoded value in the CSL signal encoded value retaining part 20 to be read and written via the global IO signal line. The input and output operation part 23 allows data in the sense amplifier register data retaining part 21 to be read and written via the bit signal line BL. The read and write control part 24 controls the read operation and write operation of the input and output operation parts 22 and 23, based on the signal level occurring on the bit signal line BL, the global IO signal line GIO, the bit line connection control signal line BLI, the bit equalizing signal line BLEQ and the sense enable signal line SE. Accordingly, the bit signal line BL provided between the sense amplifier and the I/O gate is unnecessary in simulation. Only those bits selected by the column selection line CSL are provided to the global IO signal line GIO directly from the sense amplifier register within the sense amplifier having the same bitwise width as the bit signal line BL so that the read operation and the write operation are performed via the global IO signal line GIO. Accordingly, the size of the memory consumed during the logic simulation is reduced and the time required for execution of logic simulation is reduced so that the performance of simulation is improved.

Embodiment 2

Figure 8:
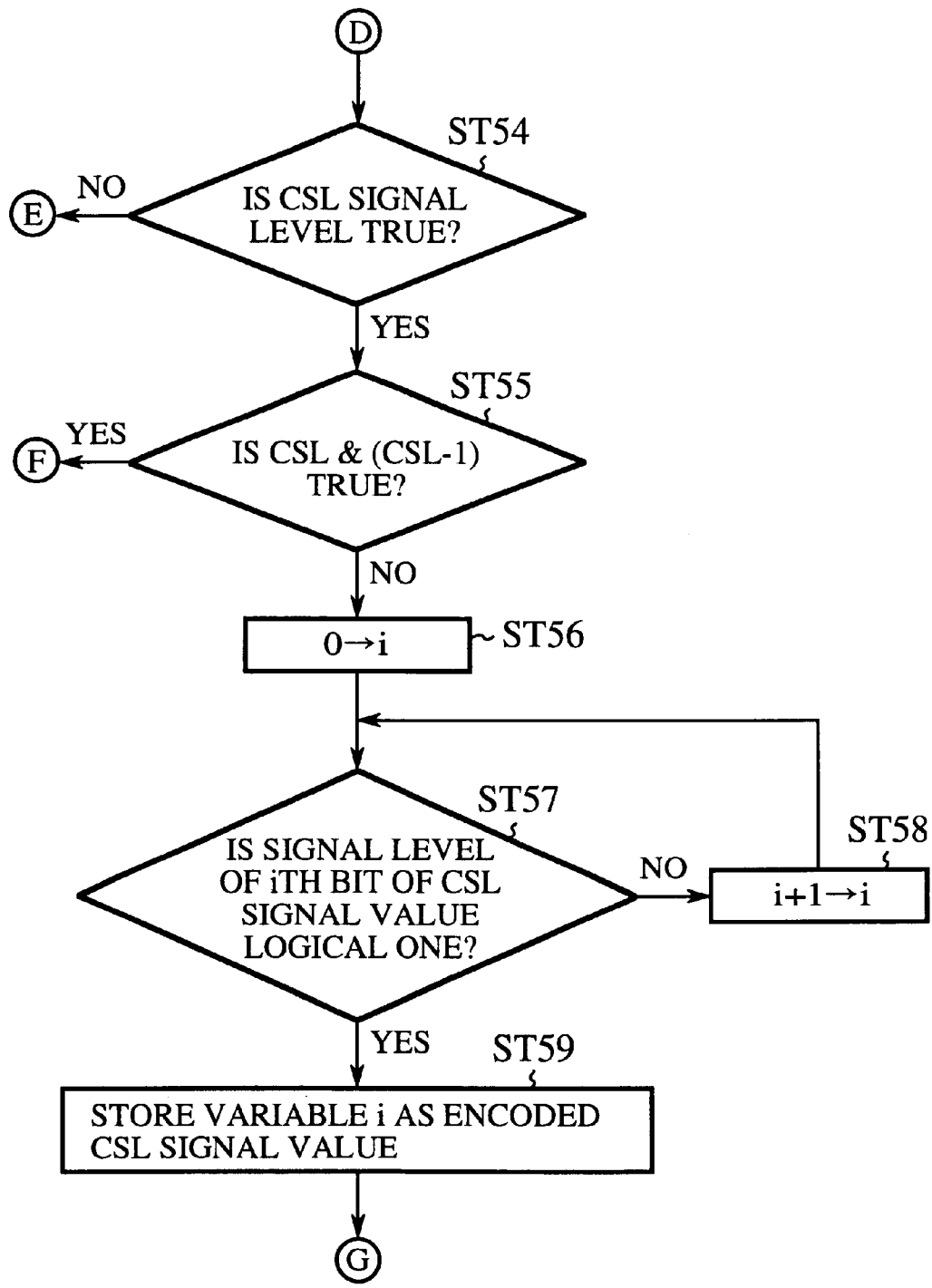
FIG. 8 is a flowchart showing a logic simulation method according to a second embodiment.

FIG. 8 is a flowchart showing a logic simulation method implemented in a logic simulation apparatus according to the second embodiment of the present invention. The construction of the logic simulation apparatus according to the second embodiment is the same as that of the logic simulation apparatus according to the first embodiment shown in FIGS. 1, 2 and 3. Like numerals represent like components and the description thereof is omitted.

A description will now be given of the operation according to the second embodiment.

The encoding process of the main word signal line MWL described in step ST14 of the flowchart of FIG. 6 and the encoding process of the subdecode signal line SD described in step ST18 are the same as the encoding process of the column selection line CSL described in step ST31 of the flowchart of FIG. 7. Accordingly, the encoding process of the column selection line CSL in the I/O gate operation will be described below as representing these encoding processes. Determination by a search as to which of a plurality of bits constituting the bitwise width of the signal line is selected, which determination is made in the encoding process of the column selection line CSL described in step ST31 of the flowchart of FIG. 7, is executed according to the flowchart of FIG. 8.

In step ST54, a check is made as to whether the signal value occurring on the column selection line CSL is true (for example, a value of one) (step ST54). When it is determined that the signal value occurring on the column selection line CSL is true, a check is made as to whether a logical product of the column selection line CSL and (CSL-1) (logical expression CSL & (CSL-1)) is true (step ST55). If it is determined that the logical product of the column selection line CSL and (CSL-1) (logical expression-CSL & (CSL-1)) is true, that means that a plurality of bits on the column selection line CSL are simultaneously selected. Therefore, the processes in steps ST56, ST57 and ST59 are not performed.

If the logical expression CSL & (CSL-1) is not true, control is turned to step ST56. In step ST56, the variable i is set to zero (step ST56).

Subsequently, in step ST57, a check is made as to whether the signal level of the ith bit of the column selection line CSL is logical one (step ST57). If it is determined that the signal level of the ith bit of the column selection line CSL is logical one, the variable i is stored as the encoded value of the column selection line CSL in step ST59 (step ST59).

If it is determined as a result of the check in step ST57 that the signal level on the ith bit of the column selection line CSL is not logical one, control is turned to step ST58, where the variable i is set to i+1 (step ST58). Control is then turned to step ST57.

As has been described, according to the second embodiment, a determination is made as to whether the level of the signal occurring on the signal lines (signal lines comprising a plurality of bits) including the main word signal line MWL, the subdecode signal line SD and the column selection signal line CSL, which are subject to encoding by the MWL signal encoding part 9, the SD signal encoding part 11 and the CSL signal encoding part 19, respectively, is true, that is, not all the bits are zero. If the signal level is true, that is, at least one of the bits is 1, a check is made as to which of the bits is selected, that is, which of the bits is at logical one. Thus, the time required for execution of logic simulation is reduced.

The various advantages provided by the present invention will now be summarized.

According to one aspect of the invention, the signal variation detection part in the memory cell array subdecode operation model providing part detects a variation in signal value occurring on the main word signal line MWL, the subdecode signal line SD and the bit signal line BL, the memory cell array and subdecoder operation model providing part operating by regarding the memory cell array and the subdecoder as one block. The WL calculating part identifies by calculation the word line, based on the MWL signal encoded value obtained by the MWL signal encoding part and the SD signal encoded value obtained by the SD signal encoding part. The first input and output operation part allows the one-word data in the memory cell selected by the word line identified by calculation by the WL calculating part 13 to be input and output via the bit signal line BL. With this, the word line WL between the memory cell array and the subdecoder can remain encoded in the operation model, while being operated to select a word in the memory cell array. Thus, the size of data constituting word line selection information can be reduced. By subjecting the main word signal line MWL and the subdecode signal line SD to encoding instead of encoding the signal on the word line WL as is conventionally done, the size of data array storing data subject to a search during encoding is reduced. Thus, the performance of simulation is improved.

According to another aspect of the invention, the signal variation detection part in the sense amplifier and I/O gate operation model providing part detects a variation in signal level occurring on the bit signal line BL, the column selection line CSL, the global IO line GIO, the bit line connection control signal line BLI, the bit line equalizing signal line BLEQ and the sense enable signal line SE, the sense amplifier and I/O gate operation model providing part operating by regarding the sense amplifier and the I/O gate as one block. The second input and output operation part allows data in the sense amplifier register retaining part which data is selected by the CSL signal encoded value to be read and written via the global IO signal line. The third input and output operation part allows data in the sense amplifier register data retaining part to be read and written via the bit signal line BL. The read and write control part controls the read operation and the write operation of the second and third input and output operation parts, based on the signal level occurring on the bit signal line BL, the global 10 signal line GIO, the bit line connection control signal line BLI, the bit equalizing signal line BLEQ and the sense enable signal line SE. Accordingly, the bit signal line BL provided between the sense amplifier and the I/O gate is unnecessary in simulation. Only those bits selected by the column selection line CSL are provided to the global IO signal line GIO directly from the sense amplifier register within the sense amplifier having the same bitwise width as the bit signal line BL so that the read operation and the write operation are performed via the global IO signal line GIO. Accordingly, the size of memory consumed during the logic simulation is reduced and the time required for execution of logic simulation is reduced.

According to still another aspect of the invention, a determination is made as to whether the level of the signal occurring on the signal lines (signal lines comprising a plurality of bits) including the main word signal line MWL, the subdecode signal line SD and the column selection line CSL subject to encoding by the MWL signal encoding part, the SD signal encoding part and the CSL signal encoding part, respectively, is true, that is, not all the bits are zero. If the signal level is true, that is, at least one of the bits is 1, a check is made as to which of the bits is selected, that is, which of the bits is at logical one. Thus, the time required for execution of logic simulation is reduced.

The present invention is not limited to the above-described embodiments, and variations and modifications may be made without departing from the scope of the present invention.

What is claimed is:

1. A mixed-level logic simulation apparatus comprising:
   memory cell array subdecoder operation model providing means for providing an operation model corresponding to a memory cell array and a subdecoder circuit;
   a sense amplifier and I/O gate operation model providing means for providing an operation model corresponding to a sense amplifier and an I/O gate circuit;
   a transistor and gate element operation model providing means for providing an operation model of a transistor and a gate element;
   circuit connection data providing means for providing circuit connection data prescribing connection of logic circuits;
   input test pattern providing means for providing a test pattern to an input part of the logic circuit;
   function and logic simulation means for executing logic simulation of the logic circuit based on the input test pattern;
   simulation result displaying means for displaying a result of simulation obtained by said function and logic simulation execution means in order to verify that a function of the logic circuit is realized, wherein
   circuit operation of the logic circuit comprising transistors, logic gates and functional blocks is tested, using models of switches, gates and functions.

2. The logic simulation apparatus to claim 1, wherein
   said memory cell array subdecoder model providing means builds an model by regarding the memory cell array and the subdecoder as one block,
   said memory cell array subdecoder providing means comprising:
   first signal variation detection means for detecting a variation in signal level occurring on a main word signal line, a subdecode signal line and a bit signal line;
   MWL signal encoding means for encoding a signal on the main word signal line;
   MWL signal encoded value retaining means for retaining an MWL signal encoded value obtained by said MWL signal encoding means;
   SD signal encoding means for encoding a signal on the subdecode signal line;
   SD signal encoded value retaining means for retaining an SD signal encoded value obtained by said SD signal encoding means;
   WL calculation means for calculating a WL value for a word number indicating a selected word line, based on the MWL signal encoded value and the SD signal encoded value;
   WL value retaining means for retaining the WL value obtained by said WL calculating means;
   memory cell data retaining means for retaining logic data corresponding to a memory cell having a size corresponding to a number obtained by multiplying a bitwise width of the word line indicated by the WL value stored in said WL value retaining part and a bitwise width of a bit signal line;
   first input and output operation means for allowing one-word data in the memory cell selected by the WL value to be read and written via the bit signal line; and
   first read and write control means for controlling a read status and a write status of said first input and output operation means, based on a signal level occurring on the bit signal line.

3. The logic simulation apparatus according to claim 1, wherein said sense amplifier and I/O gate operation model providing means builds an operation model by regarding the sense amplifier and the I/O gate as one block,
   said sense amplifier and I/O gate operation model providing means comprising:
   second signal variation detecting means for detecting variation in signal level on the bit signal line, a column selection line, a global IO line, a bit line connection control signal line, a bit line equalizing signal line and a sense enable signal line;
   CSL signal encoding means for encoding a signal on the column selection line;
   CSL signal encoded value retaining means for retaining a CSL signal encoded value obtained by said CSL signal encoding means;
   sense amplifier data retaining means for retaining logic data corresponding to the sense amplifier register corresponding to the bitwise width of the bit signal line;

second input and output operation means for allowing data in said sense amplifier register data retaining means, which data is selected based on the CSL signal encoded value stored in said CSL signal encoded value retaining part, to be read and written via the global IO signal line;

third input and output operation means for allowing data in said sense amplifier register data retaining means to be read and written via the bit signal line; and second read and write control means for controlling a read status and a write status of said second input and output operation means and said third input and output operation means, based on a signal level occurring on the bit signal line, the global IO signal line, the bit line connection control signal line, the bit line equalizing signal line and the sense enable signal line.

4. The logic simulation apparatus according to claim 2, wherein said first signal variation detection means determines whether at least one of the bits occurring on plural-bit signal lines having a width of a plurality of bits subject to encoding is 1, the plural-bit signal lines including the main word signal line and the subdecode signal line; and wherein when it is determined that at least one of the bits is 1, a determination is made as to which bit of the plurality of bits constituting a plural-bit signal is selected.

5. The logic simulation apparatus according to claim 3, wherein said second first signal variation detection means determines whether at least one of the bits occurring on plural-bit signal lines having a width of a plurality of bits subject to encoding is 1, the plural-bit signal lines including the column selection line; and wherein when it is determined that at least one of the bits is 1, a determination is made as to which bit of the plurality of bits constituting a plural-bit signal is selected.

6. A mixed-level logic simulation method comprising the steps of:

providing an operation model corresponding to a memory cell array and a subdecoder circuit, wherein a word line between the memory cell array and the subdecoder circuit remains encoded while selecting a word in the memory cell array;

providing an operation model corresponding to a sense amplifier and an I/O gate circuit, wherein a bit signal line provided between the sense amplifier and the I/O gate circuit is not simulated;

providing an operation model for transistors and gate elements;

providing circuit connection data prescribing connection of the logic circuit;

providing an input test pattern to an input part of the logic circuit;

executing logic simulation of the logic circuit, based on the input test pattern; and displaying a result of simulation in order to verify that a function of the logic circuit is realized; wherein circuit operation of the logic circuit comprising transistors, logic gates and function blocks is verified, using models of switches, gates and functions.

* * * * *